United States Patent
Nien et al.

(10) Patent No.: US 9,721,831 B2
(45) Date of Patent: Aug. 1, 2017

(54) METHOD AND APPARATUS FOR SEMICONDUCTOR PLANARIZATION

(71) Applicant: Taiwan Semiconductor Manufacturing Company, Ltd., Hsin-Chu (TW)

(72) Inventors: Po-Chin Nien, Hsin-Chu (TW); William Weilun Hong, Hsin-Chu (TW); Ying-Tsung Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/958,443

(22) Filed: Dec. 3, 2015

(65) Prior Publication Data
US 2017/0162432 A1    Jun. 8, 2017

(51) Int. Cl.
*H01L 21/8238* (2006.01)
*H01L 21/762* (2006.01)
*H01L 29/66* (2006.01)
*H01L 21/321* (2006.01)

(52) U.S. Cl.
CPC .... *H01L 21/76229* (2013.01); *H01L 21/3212* (2013.01); *H01L 29/66795* (2013.01)

(58) Field of Classification Search
None
See application file for complete search history.

(56) References Cited

U.S. PATENT DOCUMENTS

2013/0005127 A1*  1/2013  Yin .................. H01L 29/66795
                                                                438/585
2015/0380269 A1* 12/2015  Koli ................... H01L 21/3212
                                                                257/618

* cited by examiner

*Primary Examiner* — Reema Patel
(74) *Attorney, Agent, or Firm* — Slater Matsil, LLP

(57) ABSTRACT

A method includes forming a plurality of first semiconductor fins and a plurality of second semiconductor fins in a substrate, depositing a gate electrode layer over the substrate, wherein upper portions of the plurality of first semiconductor fins and the plurality of second semiconductor fins are embedded in the gate electrode layer, depositing a reverse film over the gate electrode layer and applying a chemical mechanical polish process to the reverse film and the gate electrode layer, wherein during the step of applying the chemical mechanical polish process, depositing a slurry between a polishing pad and the reverse film, and wherein a slurry selectivity ratio of the gate electrode layer to the reverse film is greater than 1.

20 Claims, 9 Drawing Sheets

METHOD AND APPARATUS FOR SEMICONDUCTOR PLANARIZATION

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The formation of fins of a FinFET may include recessing a substrate to form recesses, filling the recesses with a dielectric material, performing a chemical mechanical polish process to remove excess portions of the dielectric material above the fins, recessing a top layer of the dielectric material, so that the remaining portions of the dielectric material in the recesses form shallow trench isolation (STI) regions, depositing a gate electrode layer over the fins to form the FinFET.

A chemical mechanical polishing (CMP) process may be used to planarize the top surface of the gate electrode layer. During the CMP process, a wafer comprising the FinFET is placed in a wafer carrier. The wafer carrier is moved downward towards a polishing pad. A chemical solution, referred to as a slurry, is deposited onto the surface of the polishing pad and under the wafer to aid in the planarization process. The wafer carrier is positioned so that the face of the wafer contacts the polishing pad and the slurry. In the CMP process, the surface of the gate electrode layer may be polished using a combination of mechanical and chemical forces.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
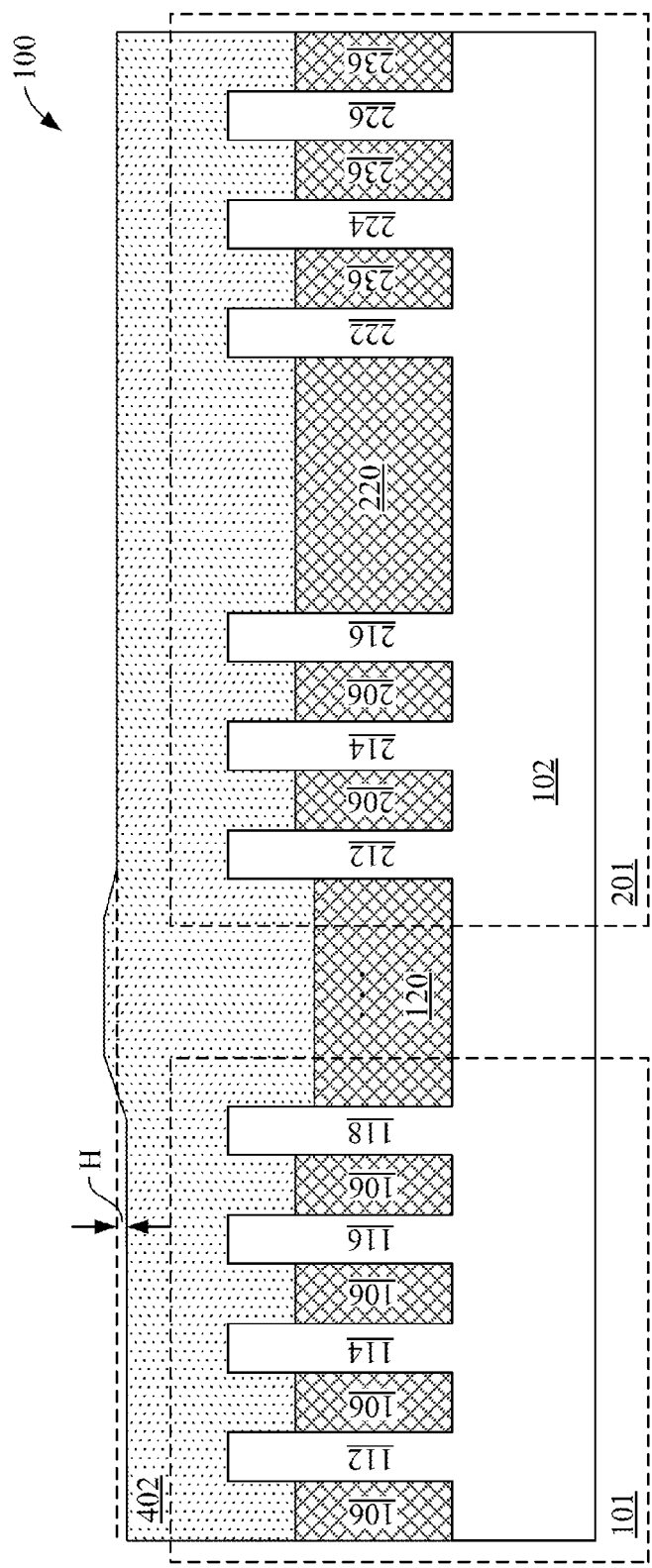
FIG. 1 illustrates a cross sectional view of a FinFET semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross sectional view of a FinFET semiconductor device in accordance with various embodiments of the present disclosure. The FinFET semiconductor device 100 includes a first region 101 and a second region 201. As shown in FIG. 1, the first region 101 and the second region 201 are formed over a substrate 102. In some embodiments, the first region 101 and the second region 201 are separated by an isolation region 120. In alternative embodiments, there may be a plurality of active circuits, isolation regions formed between the first region 101 and the second region 201.

In some embodiments, the first region includes a plurality of semiconductor fins 112, 114, 116 and 118. As shown in FIG. 1, two adjacent semiconductor fins (e.g., semiconductor fins 112 and 114) are separated by an isolation region (e.g., isolation region 106). In some embodiments, the semiconductor fins 112, 114, 116 and 118 are equally spaced apart from each other as shown in FIG. 1.

The semiconductor fins 112, 114, 116 and 118 form a plurality of transistors of a memory circuit. In some embodiments, the memory circuit is a static random-access memory (SRAM) circuit comprising a plurality of SRAM cells. Each cell of the SRAM circuit may include different numbers of transistors, and are often referred to by the number of transistors, for example, six-transistor (6T) SRAM, eight-transistor (8T) SRAM, and the like. The SRAM cells may be arranged as an array having rows and columns. Each row of the array is connected to a word line, which determines whether a cell is selected or not. Each column of the array is connected to a bit line (or a pair of complementary bit lines), which is used for writing a bit into, or reading a bit from, a cell.

It should be recognized that while FIG. 1 illustrates the first region 101 with four semiconductor fins, the first region 101 could accommodate any number of semiconductor fins. Four semiconductor fins are illustrated for simplicity.

In some embodiments, the second region 201 includes at least two groups of semiconductor fins. A first group of semiconductor fins includes semiconductor fins 212, 214 and 216. In some embodiments, the semiconductor fins 212, 214 and 216 are equally spaced apart from each other as shown in FIG. 1. Two adjacent semiconductor fins (e.g., semiconductor fins 212 and 214) are separated by an isolation region 206.

A second group of semiconductor fins includes semiconductor fins 222, 224 and 226. In some embodiments, the semiconductor fins 222, 224 and 226 are equally spaced apart from each other as shown in FIG. 1. Two adjacent semiconductor fins (e.g., semiconductor fins 222 and 224) are separated by an isolation region 236.

In some embodiments, the width of the isolation region 206 is equal to the width of the isolation region 236. In alternative embodiments, the width of the isolation region 206 is slightly different from the width of the isolation region 236.

As shown in FIG. 1, there is an isolation region 220 formed between the first group of semiconductor fins 212, 214 and 216, and the second group of semiconductor fins 222, 224 and 226. In some embodiments, the width of the isolation region 220 is greater the width of the isolation regions 206 and 236. In alternative embodiments, the width of the isolation region 220 is at least five times greater the width of the isolation regions 206 and 236. In some embodiments, the semiconductor fins of the second region 201 form a plurality of test line critical dimension (TCD) devices.

It should be noted that while FIG. 1 shows each group in the second region 201 includes three semiconductor fins (e.g., semiconductor fins 212, 214 and 216), this is merely an example. One skilled in the art will recognize there may be various modifications, alternatives and variations. For example, each group of the second region 201 may accommodate any number of semiconductor fins depending on different applications and design needs.

Furthermore, FIG. 1 shows the number of semiconductor fins in the first group is equal to the number of semiconductor fins in the second group. This is merely an example. In alternative embodiments, the number of semiconductor fins in the first group may be not equal to the number of semiconductor fins in the second group.

The substrate 102 may be formed of silicon. Other commonly used materials, such as carbon, germanium, gallium, arsenic, nitrogen, indium, and/or phosphorus, and the like, may also be included in the substrate 102. The substrate 102 may be a bulk substrate or a semiconductor-on-insulator (SOI) substrate.

The isolation regions 106, 120, 206, 220 and 236 may be implemented by a shallow trench isolation (STI) structure. The STI structure (e.g., isolation region 220) may be fabricated by using suitable techniques including photolithography and etching processes. In particular, the photolithography and etching processes may include depositing a commonly used mask material such as photoresist over the substrate 102, exposing the mask material to a pattern, etching the substrate 102 in accordance with the pattern. In this manner, a plurality of openings may be formed as a result.

The openings are then filled with dielectric materials to form the STI structures (e.g., isolation regions 220). In accordance with an embodiment, the isolation regions may be filled with a dielectric material such as an oxide material, a high-density plasma (HDP) oxide or the like. Alternatively, the dielectric material may be formed of materials selected from the group consisting of silicon oxide, silicon nitride, silicon carbon nitride, silicon oxy-carbon nitride and any combinations thereof. The dielectric material may be deposited through suitable deposition techniques such as chemical vapor deposition (CVD), sub-atmospheric CVD (SACVD), high density plasma CVD (HDPCVD) and/or the like.

A chemical mechanical polishing (CMP) process is then applied to the portion of the dielectric material over the top surface of the substrate 102. As a result, excess portions of the dielectric material have been removed. The remaining portions of the dielectric material are the isolation regions (e.g., isolation region 220).

FIG. 1 further illustrates a gate electrode layer 402 formed over the substrate 102. More particularly, the upper portions of the semiconductor fins 112-118, 212-216 and 222-226 are surrounded by the gate electrode layer 402. It should be noted while FIG. 1 illustrates the semiconductor fins surrounded by the electrode layer 402, there may be gate dielectric layer (not shown) formed underneath the gate electrode layer 402.

The gate dielectric layer may be formed of oxide materials and formed by suitable oxidation processes such as wet or dry thermal oxidation, sputtering or by CVD techniques using tetra-ethyl-ortho-silicate (TEOS) and oxygen as a precursor. In addition, the gate dielectric layer may be a high-K dielectric material (K>10), such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof and/or the like.

In some embodiments, the gate electrode layer 402 may be formed of polysilicon. Alternatively, the gate the gate electrode layer 402 may include a conductive material selected from a group comprising of poly-crystalline silicon-germanium, metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

The gate electrode layer 402 may formed by suitable fabrication processes such as CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer deposition (ALD) and/or the like.

As shown in FIG. 1, the gate electrode layer 402 has an uneven top surface. More particularly, the top surface over the second region 201 is higher than the top surface over the first region 101. The difference between the top surface over the second region 201 and the top surface over the first region 101 is defined as H as shown in FIG. 1. In some embodiments, H is in a range from about 20 angstroms to about 100 angstroms.

FIGS. 2-7 illustrate intermediate steps of fabricating the semiconductor device shown in FIG. 1 in accordance with various embodiments of the present disclosure. It should be noted that the fabrication steps as well as the semiconductor device shown in FIGS. 2-7 are merely an example. A person skilled in the art will recognize there may be many alternatives, variations and modifications.

Figure 2:
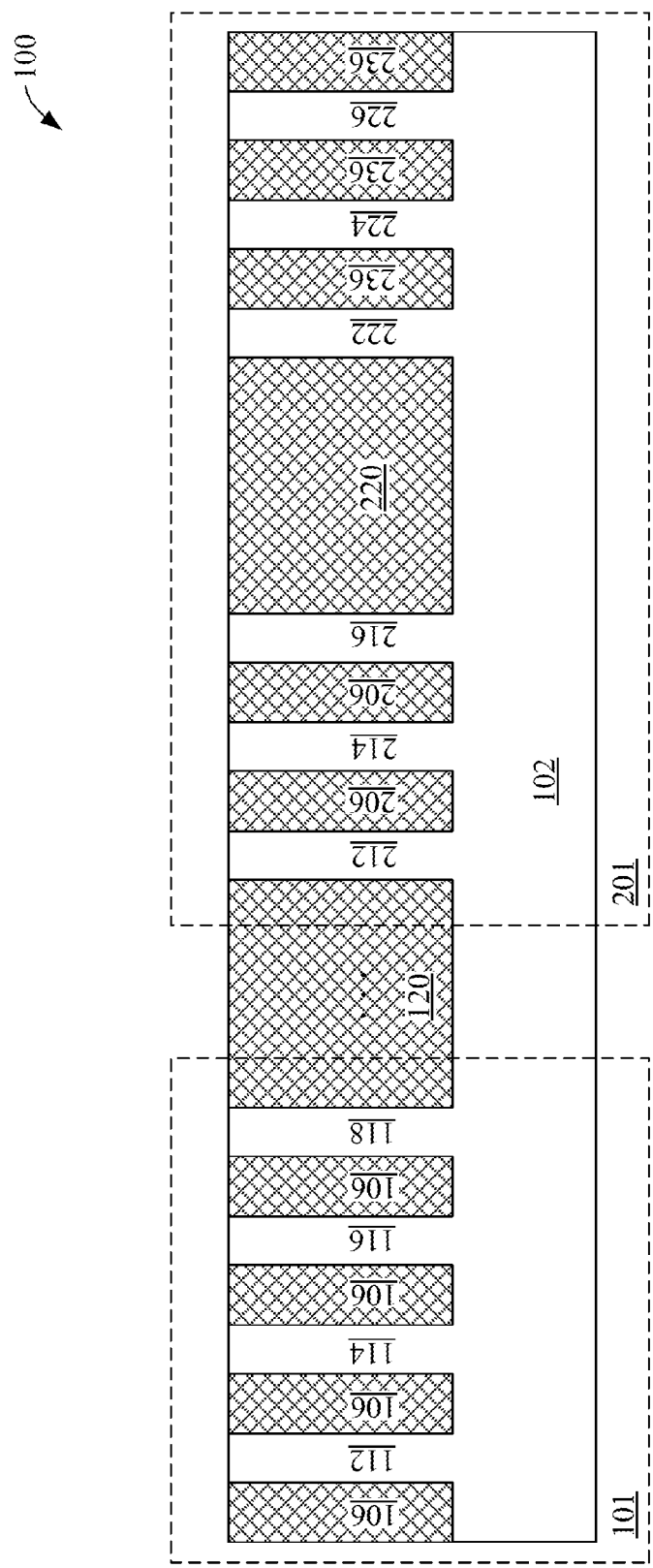
FIG. 2 illustrates a cross sectional view of a semiconductor substrate having a plurality of isolation regions in accordance with various embodiments of the present disclosure.

FIG. 2 illustrates a cross sectional view of a semiconductor substrate having a plurality of isolation regions in accordance with various embodiments of the present disclosure. The semiconductor substrate 102 may be a silicon substrate. Alternatively, the semiconductor substrate 102 may include other semiconductor materials such as germanium, compound semiconductor materials such as silicon carbide, gallium arsenide, indium arsenide, indium phosphide and the like. In accordance with an embodiment, the semiconductor substrate 102 may be a crystalline structure. In accordance with another embodiment, the semiconductor substrate 102 may be a silicon-on-insulator (SOI) substrate.

The semiconductor substrate 102 may be divided into two regions, namely a first region 101 and a second region 201. There may be a plurality of isolation regions 106 formed in the first region 101. Likewise, there may be a plurality of isolation regions 206, 220 and 236 formed in the second region 201. Furthermore, there may be at least one isolation region 120 formed between the first region 101 and the second region 201 as shown in FIG. 2.

The isolation regions shown in FIG. 2 (e.g., isolation region 220) may be implemented by an STI structure. The structure and fabrication processes of the STI structure have been described above with respect to FIG. 1, and hence are not discussed in further detail herein to avoid unnecessary repetition.

As shown in FIG. 2, each isolation region (e.g., isolation region 106) may be portions of a continuous region, which may form an isolation ring in accordance with an embodiment. Alternatively, the isolation region 106 may be two separate isolation regions having their sidewalls facing each other.

Figure 3:
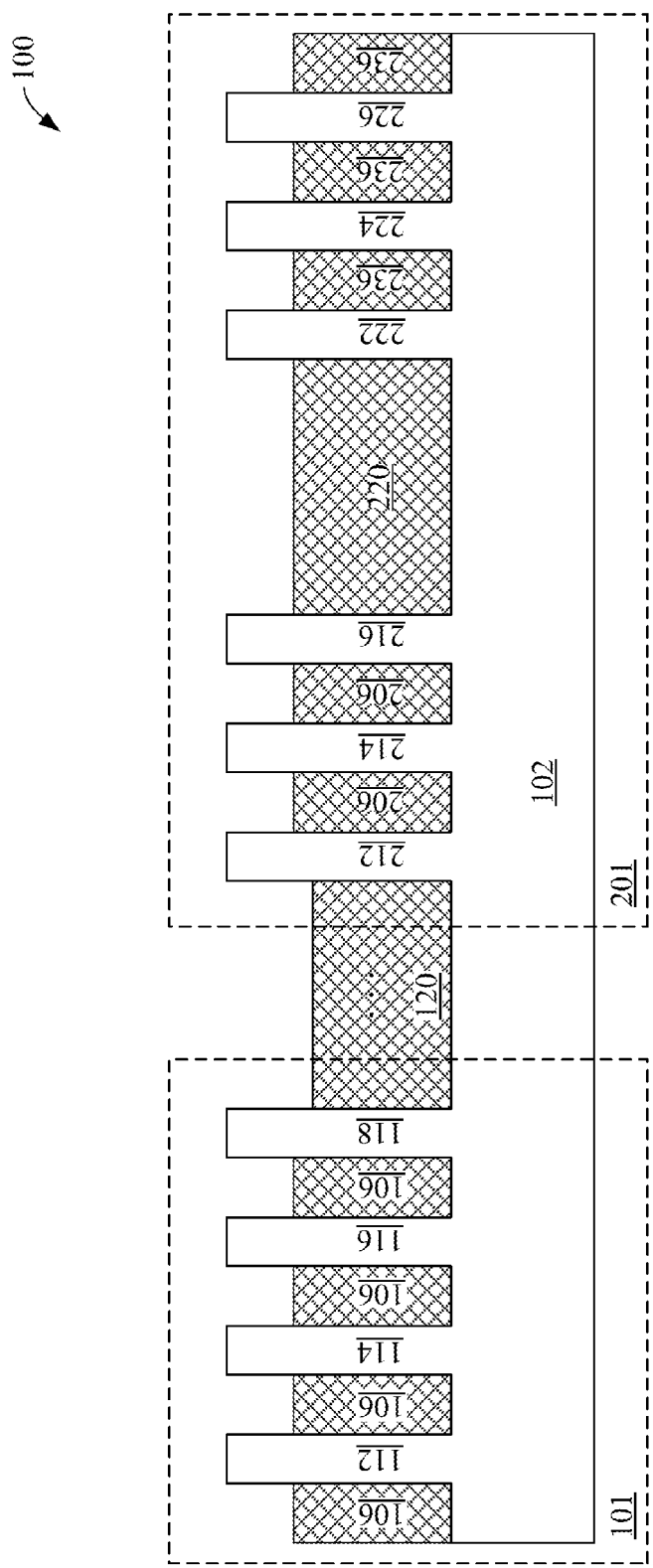
FIG. 3 illustrates a cross sectional view of the semiconductor device shown in FIG. 2 after a recessing process is applied to the semiconductor device in accordance with various embodiments of the present disclosure.

FIG. 3 illustrates a cross sectional view of the semiconductor device shown in FIG. 2 after a recessing process is applied to the semiconductor device in accordance with various embodiments of the present disclosure. The isolation regions 106, 120, 206, 220 and 236 are recessed such that respective fins 112-118, 212-216 and 222-226 may protrude over the top surfaces of the isolation regions 106, 120, 206, 220 and 236. The isolation regions 106, 120, 206, 220 and 236 may be recessed using a suitable etching process, such as one that is selective to the material of the isolation regions 106, 120, 206, 220 and 236. For example, a chemical oxide removal (COR) using a Tokyo Electron CERTAS, an Applied Material SICONI tool and/or the like may be used. Alternatively, suitable wet etching processes such as dilute hydrofluoric (dHF) acid may be used.

After the recessing process finishes, the semiconductor fins 112, 114, 116 and 118 protrude over the top surface of the isolation region 106. Likewise, the semiconductor fins 212, 214 and 216 protrude over the top surface of the isolation region 206. The semiconductor fins 222, 224 and 226 protrude over the top surface of the isolation region 236. As shown in FIG. 3, the top surface of the isolation region 120 is lower than the top surfaces of its adjacent isolation regions (e.g., isolation regions 106 and 206).

It should be noted the fin formation process described above is merely an example. A person skilled in the art will recognize that there may be many alternatives, variations and modifications. For example, the semiconductor fins shown in FIG. 3 may be formed by an epitaxial growth process.

The fin formation process based upon an epitaxial growth process includes forming a plurality of isolation regions in the substrate 102, forming a recess between two adjacent isolation regions by removing a portion of the substrate 102, growing a semiconductor material in the recess and recessing the isolation regions to form a plurality of semiconductor fins protruding over the top surfaces of the isolation regions.

In some embodiments, the semiconductor material grown in the recess is silicon germanium. Silicon germanium may be grown by using suitable techniques such as selective epitaxial growth (SEG) and the like.

Figure 4:
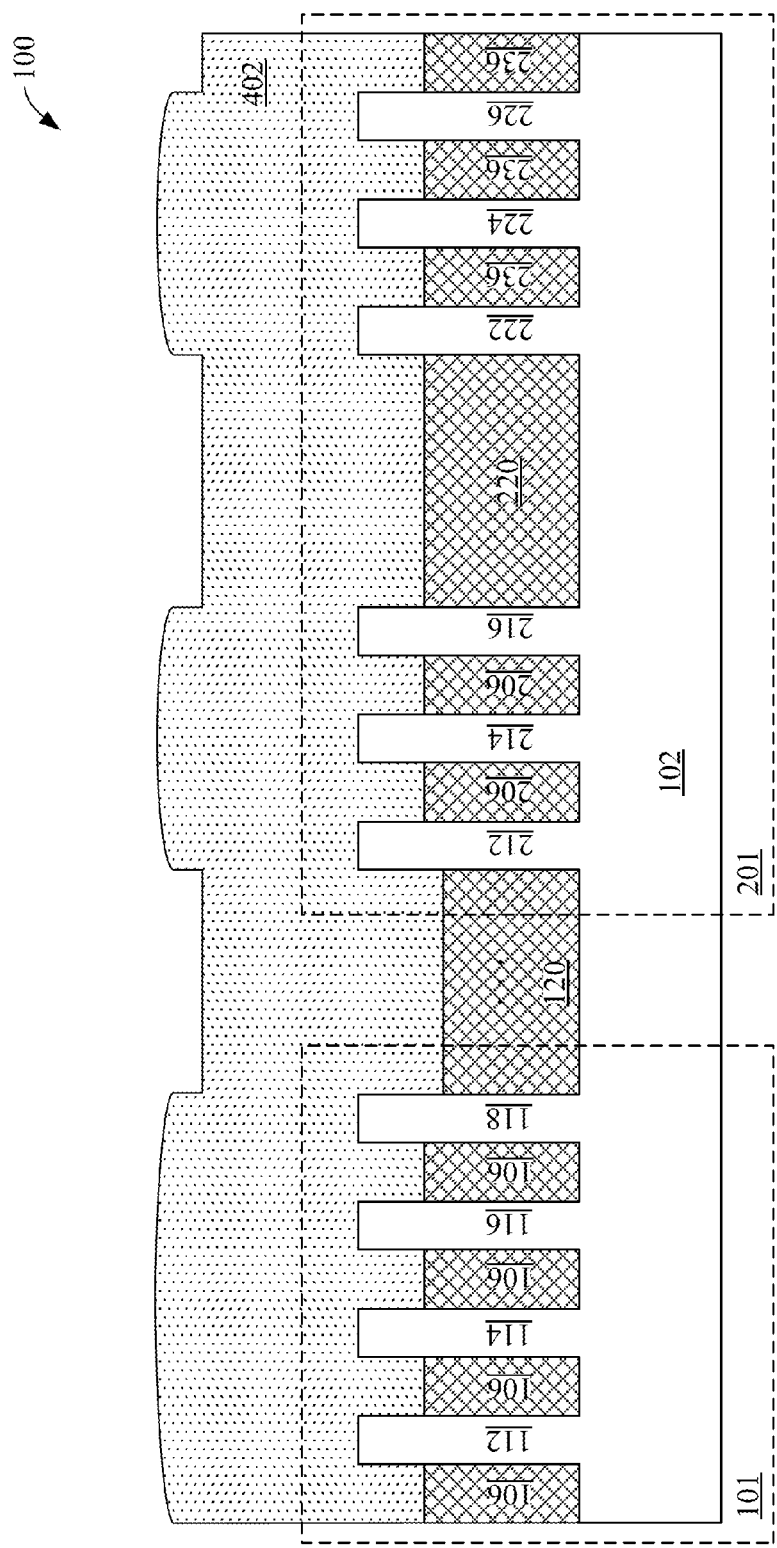
FIG. 4 illustrates a cross sectional view of the semiconductor device shown in FIG. 3 after a gate electrode layer is formed over the semiconductor fins in accordance with various embodiments of the present disclosure.

FIG. 4 illustrates a cross sectional view of the semiconductor device shown in FIG. 3 after a gate electrode layer is formed over the semiconductor fins in accordance with various embodiments of the present disclosure. A gate dielectric layer (not shown) may be deposited over the semiconductor fins before depositing the gate electrode layer over the semiconductor fins. The gate dielectric layer may be formed of oxide materials and formed by suitable oxidation processes such as wet or dry thermal oxidation, sputtering or by CVD techniques. In addition, the gate dielectric layer may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

The gate electrode layer 402 may be formed by a deposition process such as CVD, PVD, ALD and any combinations thereof. In some embodiments, the gate electrode layer 402 is formed of polysilicon. In alternative embodiments, the gate electrode layer 402 may include a conductive material selected from a group comprising of poly-crystalline silicon-germanium (poly-SiGe), metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

As shown in FIG. 4, the top surface of the gate electrode layer 402 is not planar. There are many bumpy regions. In particular, there is one large bumpy region over the first region 101 and a plurality of small bumpy regions over the second region 201. It should be noted the formation of the bumpy regions shown in FIG. 4 is caused by the fin topography shown in FIG. 4. More particularly, the large bumpy region is formed over a region having a higher pattern density (e.g., the first region 101). The plurality of small bumpy regions may be formed over a region having a lower pattern density (e.g., the second region 201).

A suitable planarization process such as CMP may be employed to remove the bumpy regions. The detailed processes of polishing the top surface of the gate electrode layer 402 will be described below with respect to FIGS. 5-7.

Figure 5:
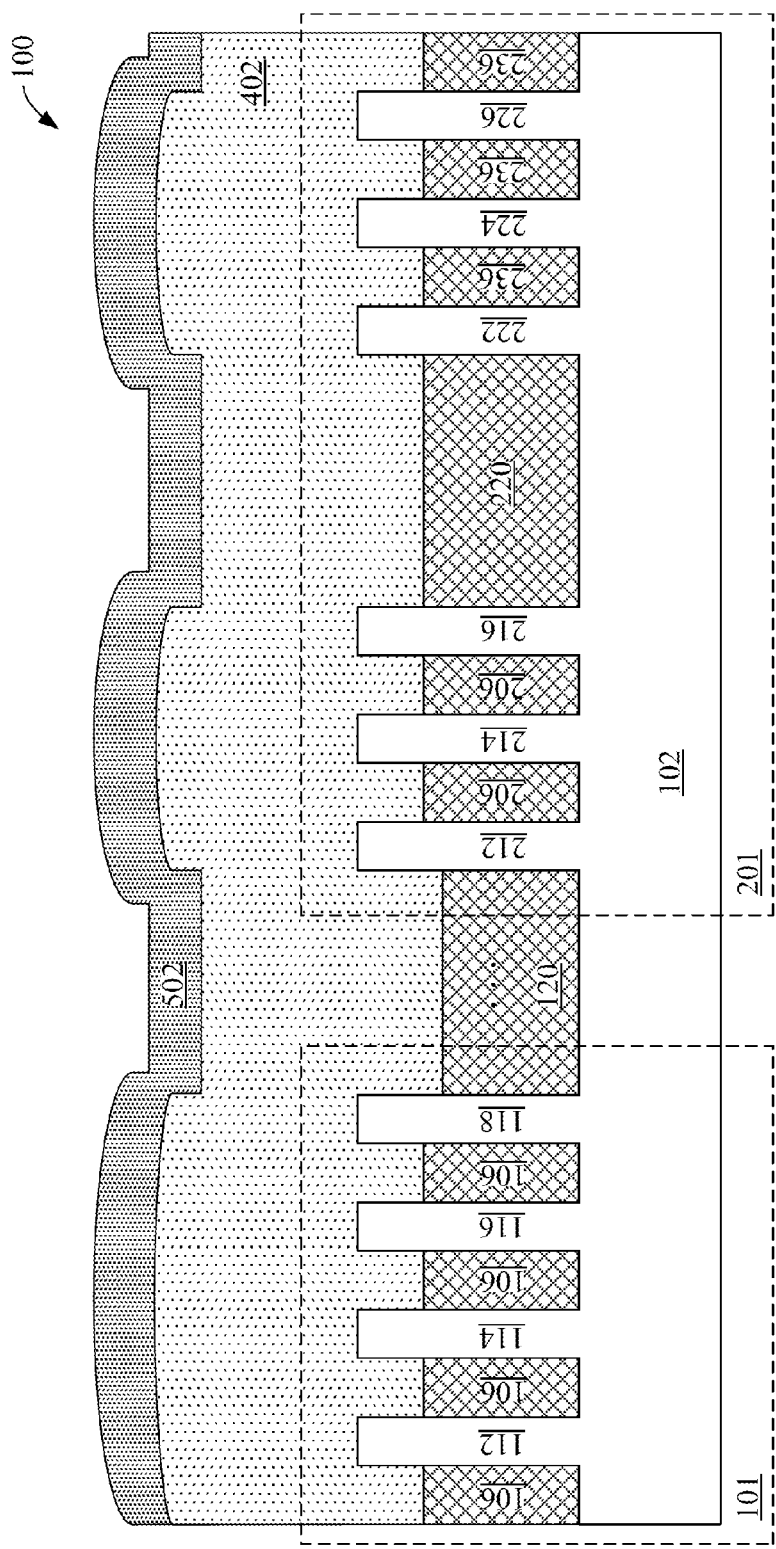
FIG. 5 illustrates a cross sectional view of the semiconductor device shown in FIG. 4 after a reverse film is deposited over the gate electrode layer in accordance with various embodiments of the present disclosure.

FIG. 5 illustrates a cross sectional view of the semiconductor device shown in FIG. 4 after a reverse film is deposited over the gate electrode layer in accordance with various embodiments of the present disclosure. The reverse film 502 may be formed of oxide materials, nitride materials, any combinations thereof and the like. The reverse film 502 may be formed by suitable oxidation processes such as wet or dry thermal oxidation. Alternatively, the reverse film 502 may be formed by CVD, PVD, ALD, any combinations thereof and the like. In some embodiments, the reverse film 502 is conformally deposited over the gate electrode layer 402 as shown in FIG. 5.

Figure 6:
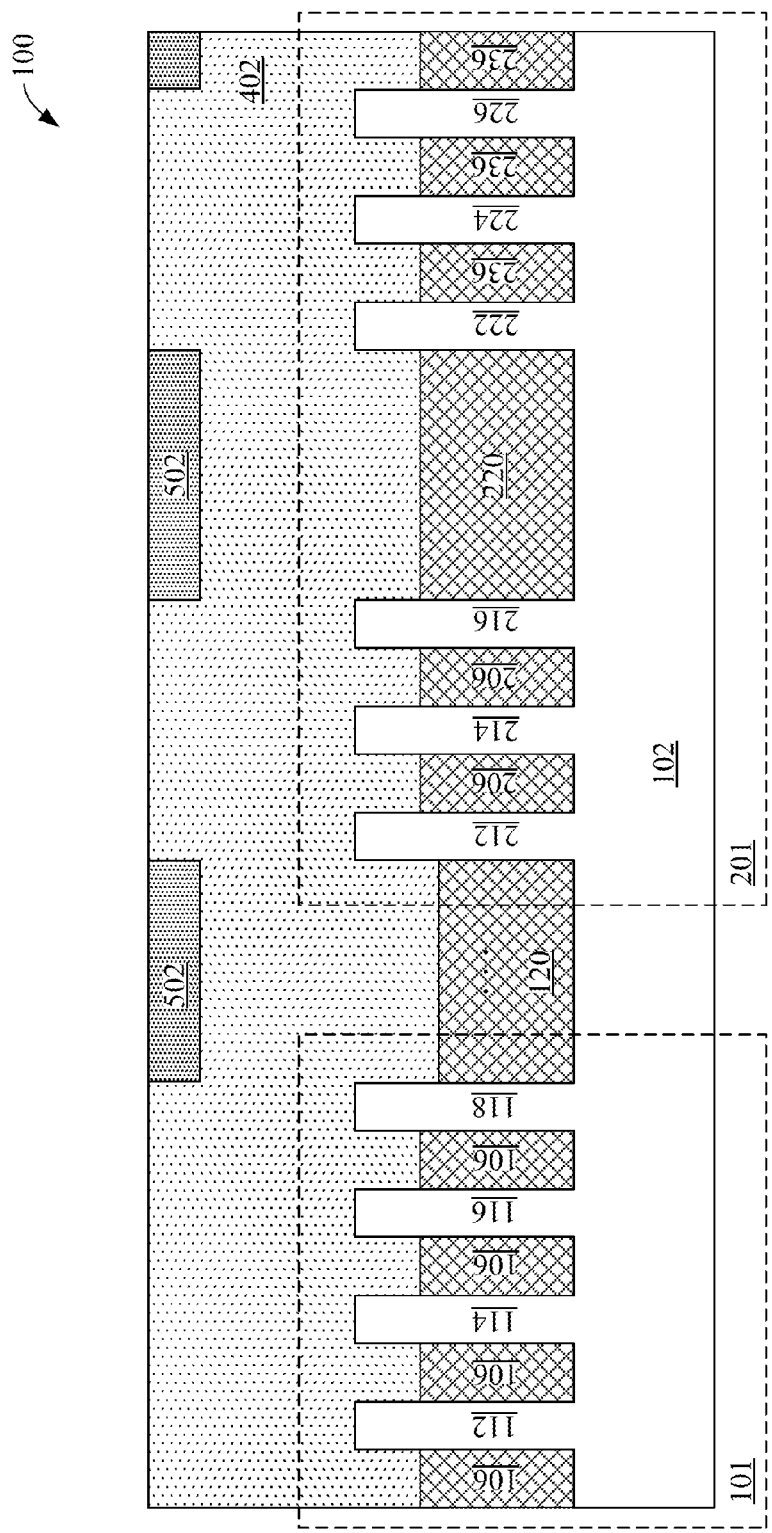
FIG. 6 illustrates a cross sectional view of the semiconductor device illustrated in FIG. 5 after a chemical mechanical polishing process has been applied to the protruded portions of the semiconductor device in accordance with various embodiments of the present disclosure.

FIG. 6 illustrates a cross sectional view of the semiconductor device illustrated in FIG. 5 after a chemical mechanical polishing process has been applied to the protruded portions of the semiconductor device in accordance with various embodiments of the present disclosure. The CMP process is performed on the reverse film 502 until the top surface of the gate electrode layer 402 is exposed. After the protruded portions of the reverse film 502 have been removed, the top surface of the gate electrode layer 402 over the first region 101 is approximately level with the top surface of the gate electrode layer 402 over the second region 201. Due to the uneven surface of the gate electrode layer 402 shown in FIGS. 4-5, portions of the reverse film 502 remain in the gate electrode layer 402 as shown in FIG. 6.

As described above with respect to FIG. 1, the first region 101 includes a plurality of fins of SRAM devices. As a result, the pattern density of the first region 101 is higher. On the other hand, the second region 201 includes a plurality of fins of TCD devices. There are large isolation regions (e.g., isolation region 220) in the second region 201. As a result, the second region 201 has a lower pattern density.

In a conventional CMP process, the polishing rate of the second region 201 (a lower pattern density region) is faster than that of the first region 101 (a higher pattern density region). Such a polishing rate difference may cause an undesirable top surface. The remaining portions of the reverse film 502 shown in FIG. 6 help to control the polishing rates of the gate electrode layer 402 so as to achieve a desirable top surface.

During the CMP process, a slurry (not shown) is deposited onto the surface of a polishing pad to aid in the planarization process. In order to control the polishing rates of the gate electrode layer 402 over the first region 101 and the second region 201, a slurry selectivity ratio of the polysilicon layer to the reverse film is greater than 1. In some embodiments, the reverse film is formed of oxide. The slurry has a selectivity of 2:1 with respect to polysilicon and oxide. In alternative embodiments, the reverse film is formed of nitride. The slurry has a selectivity of 2:1 with respect to polysilicon and nitride.

In some embodiments, the slurry includes silicon dioxide, ammonium hydroxide, organic compounds and water. The content of silicon dioxide is less than 10%. The content of ammonium hydroxide is less than 0.5%. The content of organic compounds is less than 0.5%. The content of water is more than 89%.

Figure 7:
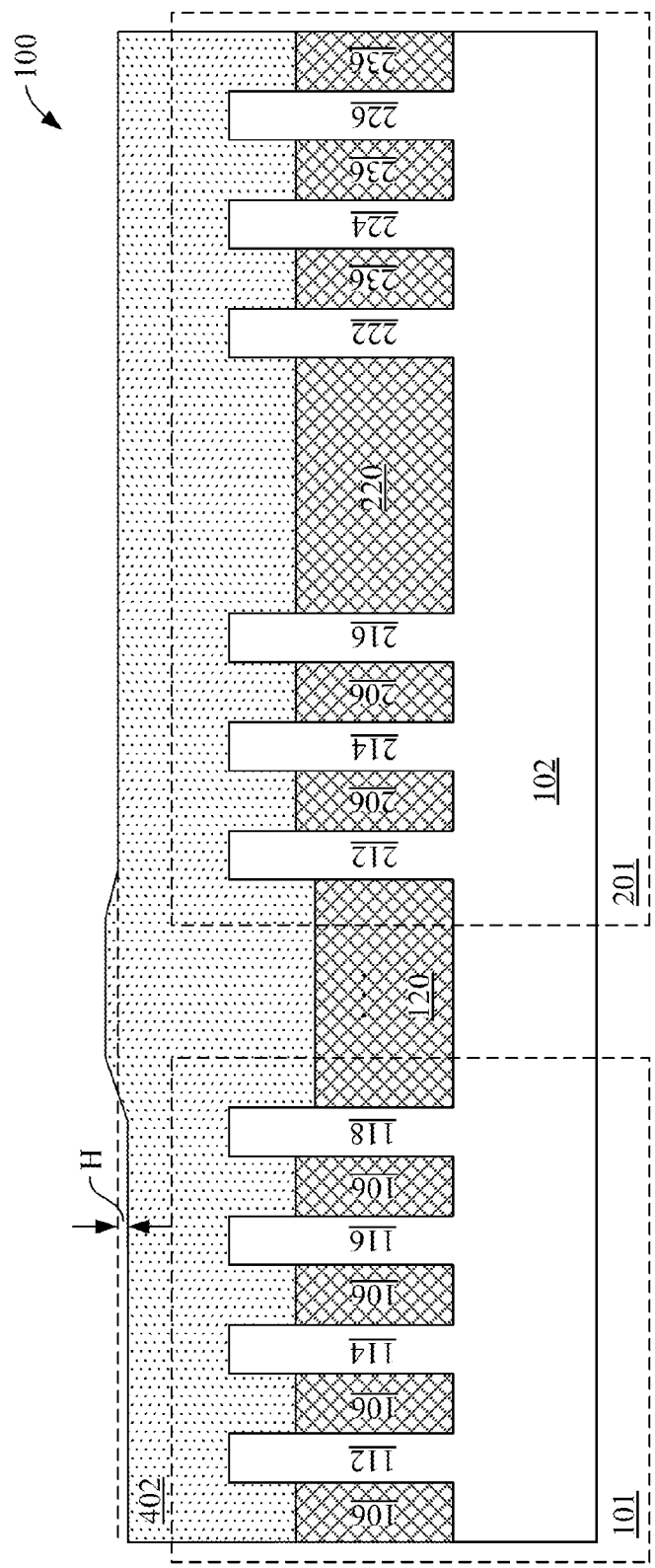
FIG. 7 illustrates a cross sectional view of the semiconductor device illustrated in FIG. 6 after the chemical mechanical polishing process finishes in accordance with various embodiments of the present disclosure.

FIG. 7 illustrates a cross sectional view of the semiconductor device illustrated in FIG. 6 after the chemical mechanical polishing process finishes in accordance with various embodiments of the present disclosure. Due to the selectivity of the slurry and the remaining portions of the reverse film 502 shown in FIG. 6, the polishing rate of the gate electrode layer 402 over the first region 101 is faster than the polishing rate of the gate electrode layer 402 over the second region 201. As a result, the top surface of the gate electrode layer 402 over the first region 101 is lower than the top surface of the gate electrode layer 402 over the second region 201 as shown in FIG. 7. In some embodiments, the height difference H is in a range from about 20 angstroms to about 100 angstroms.

Figure 8:
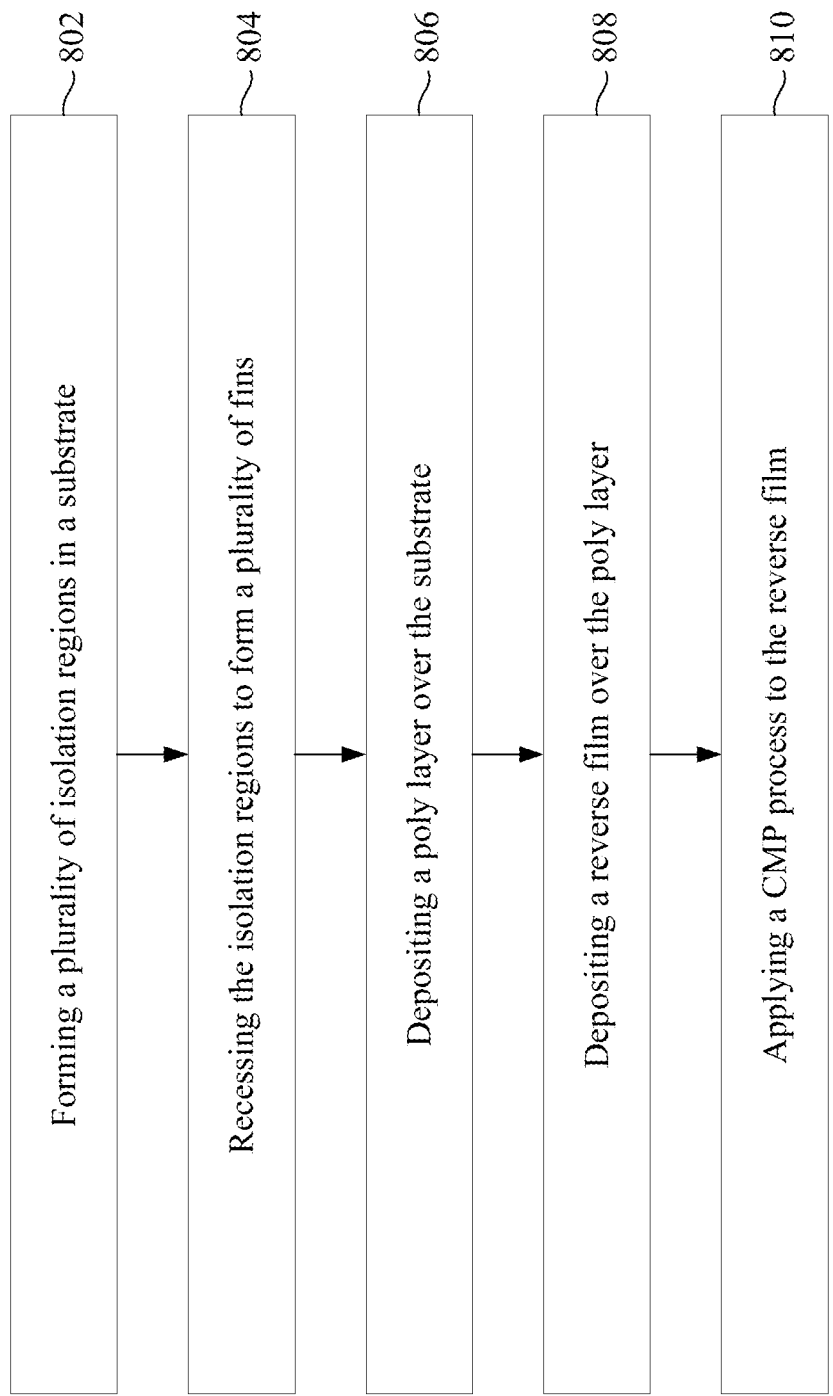
FIG. 8 illustrates a flow chart of a method for forming the semiconductor device shown in FIG. 1 in accordance with various embodiments of the present disclosure.

FIG. 8 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 8 may added, removed, replaced, rearranged and repeated.

At step 802, a plurality of isolation regions such as STI regions are formed in a substrate. The STI structures may be fabricated by using suitable techniques including photolithography and etching processes. At step 804, a plurality of semiconductor fins are formed through recessing the isolation regions.

At step 806, a gate dielectric layer is deposited over the semiconductor fins. A gate electrode layer is deposited over the gate dielectric layer. The gate electrode layer is formed of polysilicon.

At step 808, a reverse film is conformally deposited on the gate electrode layer. In some embodiments, the reverse film is formed of oxide. In alternative embodiments, the reverse film is formed of nitride.

At step 810, a CMP process is performed on the reverse film and the gate electrode layer. During the CMP process, a slurry is selected such as the gate electrode layer over a higher pattern density region (e.g., first region 101 shown in FIG. 1) has a faster polishing rate than the reverse film and the gate electrode layer over a lower pattern density region (e.g., second region 201 shown in FIG. 1). In some embodiments, the slurry has a polishing selectivity of 2:1 with respect to polysilicon and oxide.

Figure 9:
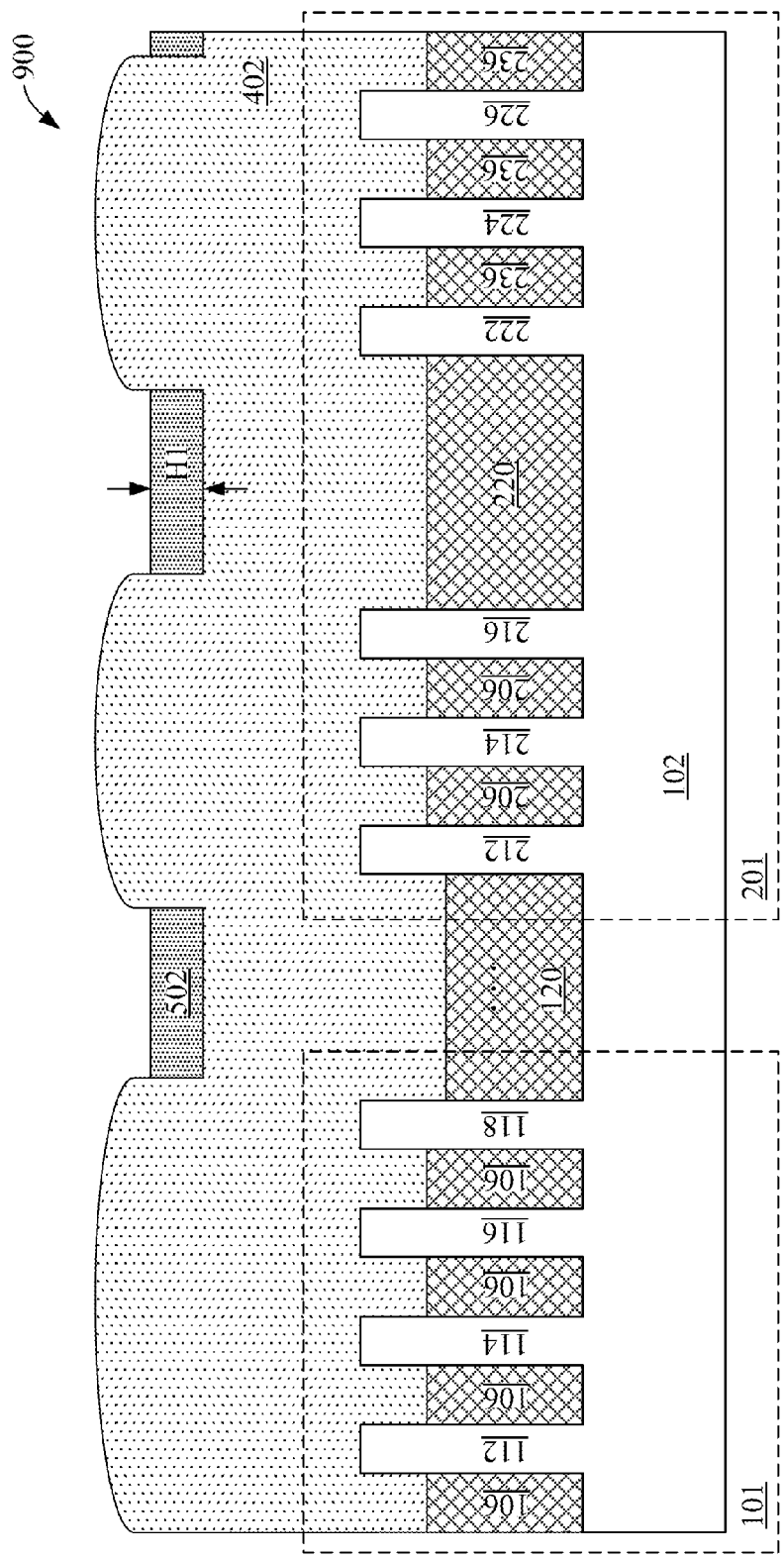
FIG. 9 illustrates a cross sectional view of a semiconductor device after a reverse film is deposited over the gate electrode layer in accordance with various embodiments of the present disclosure.

FIG. 9 illustrates a cross sectional view of a semiconductor device after a reverse film is deposited over the gate electrode layer in accordance with various embodiments of the present disclosure. The semiconductor device 900 shown in FIG. 9 is similar to the semiconductor device 100 shown in FIG. 5 except that the reverse film 502 shown in FIG. 9 is only deposited in the gaps between two bumpy regions. The top surface of the reverse film 502 is lower than the top surfaces of the bumpy regions. The height difference H shown in FIG. 1 can be adjusted by controlling the thickness H1 of the reverse film 502 shown in FIG. 9.

The reverse film 502 shown in FIG. 9 is of a thickness in a range from about 100 angstroms to about 500 angstroms. It should be noted that the thickness of the reverse film 502 may vary depending on different applications and design needs. More particularly, the height difference H shown in FIG. 1 is proportional to the thickness H1 of the reverse film 502 shown in FIG. 9. In some embodiments, the height difference H is approximately equal to 20 angstroms when the reverse film 502 shown in FIG. 9 has a thickness equal to 100 angstroms. Likewise, the height difference H is approximately equal to 100 angstroms when the reverse film 502 shown in FIG. 9 has a thickness equal to 500 angstroms.

The height of the gate electrode layer is related to the transistor's performance such as short circuit, high gate resistance and/or the like. In a conventional CMP process, the height of the gate electrode layer over the second region 201 is lower than the height of the gate electrode layer over the first region 101. Furthermore, the gate height difference over these two regions is an uncontrollable variable. One advantageous feature of having the reverse film 502 shown in FIG. 9 is the height difference H shown in FIG. 1 becomes a controllable variable. More particularly, the height difference H can be adjusted through controlling the thickness of the reverse film 502 shown in FIG. 9.

In accordance with an embodiment, a method comprises etching portions of a substrate to form a plurality of first isolation regions and a second isolation region, forming a plurality of first semiconductor fins and a plurality of second semiconductor fins, wherein two adjacent first semiconductor fins are separated by a first isolation region and at least two second semiconductor fins are separated by the fourth isolation region, and wherein a width of the fourth isolation region is greater than a width of the first isolation region.

The method further comprises depositing a gate electrode layer over the substrate, wherein upper portions of the plurality of first semiconductor fins and the plurality of second semiconductor fins are embedded in the gate electrode layer, depositing a reverse film over the gate electrode layer and applying a chemical mechanical polish process to the reverse film and the gate electrode layer with a slurry having a polishing selectivity of greater than 1 with respect to the gate electrode layer and the reverse film.

In accordance with an embodiment, a method comprises forming a plurality of first semiconductor fins and a plurality of second semiconductor fins over a substrate, wherein two adjacent first semiconductor fins are separated by a first isolation region and at least two second semiconductor fins are separated by a second isolation region, and wherein a width of the second isolation region is greater than a width of the first isolation region.

The method further comprises depositing a gate electrode layer over the plurality of first semiconductor fins and the plurality of second semiconductor fins, depositing a reverse film over the gate electrode layer and applying a chemical mechanical polish process to the reverse film and the gate electrode layer with a slurry having a polishing selectivity of greater than 1 with respect to the gate electrode layer and the reverse film, wherein after the step of applying the chemical mechanical polish process, a top surface of the gate electrode layer over the second semiconductor fins is higher than a top surface of the gate electrode layer over the first semiconductor fins.

In accordance with an embodiment, a method comprises forming a plurality of first semiconductor fins and a plurality of second semiconductor fins in a substrate, depositing a gate electrode layer over the substrate, wherein upper portions of the plurality of first semiconductor fins and the plurality of second semiconductor fins are embedded in the gate electrode layer, depositing a reverse film over the gate electrode layer and applying a chemical mechanical polish process to the reverse film and the gate electrode layer, wherein during the step of applying the chemical mechanical polish process, depositing a slurry between a polishing pad and the reverse film, and wherein a slurry selectivity ratio of the gate electrode layer to the reverse film is greater than 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching portions of a substrate to form a plurality of first isolation regions and a second isolation region;
    forming a plurality of first semiconductor fins and a plurality of second semiconductor fins, wherein:
        two adjacent first semiconductor fins are separated by a first isolation region; and
        at least two second semiconductor fins are separated by the second isolation region, and wherein a width of the second isolation region is greater than a width of the first isolation region;
    depositing a gate electrode layer over the substrate, wherein upper portions of the plurality of first semiconductor fins and the plurality of second semiconductor fins are embedded in the gate electrode layer;
    depositing a reverse film over the gate electrode layer; and
    applying a chemical mechanical polish process to the reverse film and the gate electrode layer with a slurry having a polishing selectivity of greater than 1 with respect to the gate electrode layer and the reverse film, wherein a top surface of the gate electrode layer over the second semiconductor fins is higher than a top surface of the gate electrode layer over the first semiconductor fins.

2. The method of claim 1, wherein:
    the reverse film is formed of an oxide material.

3. The method of claim 1, wherein:
    the reverse film is formed of a nitride material.

4. The method of claim 1, further comprising:
    depositing the gate electrode layer over the substrate, wherein the gate electrode layer has an uneven top surface; and
    conformally depositing the reverse film over the gate electrode layer.

5. The method of claim 4, further comprising:
    applying the chemical mechanical polish process to the reverse film until the uneven top surface of the gate electrode layer is exposed.

6. The method of claim 1, further comprising:
    depositing a gate dielectric layer underneath the gate electrode layer.

7. The method of claim 1, wherein:
    a height difference between the top surface of the gate electrode layer over the second semiconductor fins and the top surface of the gate electrode layer over the first semiconductor fins is proportional to a thickness of the reverse film.

8. The method of claim 1, wherein:
the width of the second isolation region is at least five times greater than the width of the first isolation region.

9. The method of claim 1, further comprising:
during the step of applying the chemical mechanical polish process to the reverse film and the gate electrode layer, depositing the slurry between a polishing pad and the reverse film, wherein the slurry has a polysilicon to oxide selectivity ratio of greater than 1.

10. The method of claim 1, further comprising:
during the step of applying the chemical mechanical polish process to the reverse film and the gate electrode layer, depositing a slurry between a polishing pad and the reverse film, wherein the slurry has a polysilicon to nitride selectivity ratio of greater than 1.

11. A method comprising:
forming a plurality of first semiconductor fins and a plurality of second semiconductor fins over a substrate, wherein:
two adjacent first semiconductor fins are separated by a first isolation region; and
at least two second semiconductor fins are separated by a second isolation region, and wherein a width of the second isolation region is greater than a width of the first isolation region;
depositing a gate electrode layer over the plurality of first semiconductor fins and the plurality of second semiconductor fins;
depositing a reverse film over the gate electrode layer; and
applying a chemical mechanical polish process to the reverse film and the gate electrode layer with a slurry having a polishing selectivity of greater than 1 with respect to the gate electrode layer and the reverse film, wherein after the step of applying the chemical mechanical polish process, a top surface of the gate electrode layer over the second semiconductor fins is higher than a top surface of the gate electrode layer over the first semiconductor fins.

12. The method of claim 11, wherein:
after the step of depositing the gate electrode layer, upper portions of the plurality of first semiconductor fins and the plurality of second semiconductor fins are embedded in the gate electrode layer.

13. The method of claim 11, further comprising:
etching portions of the substrate to form the first isolation region and the second isolation region.

14. The method of claim 11, wherein:
the gate electrode layer is formed of polysilicon.

15. A method comprising:
forming a plurality of first semiconductor fins and a plurality of second semiconductor fins in a substrate;
depositing a gate electrode layer over the substrate, wherein upper portions of the plurality of first semiconductor fins and the plurality of second semiconductor fins are embedded in the gate electrode layer;
depositing a reverse film over the gate electrode layer; and
applying a chemical mechanical polish process to the reverse film and the gate electrode layer, wherein:
during the step of applying the chemical mechanical polish process, depositing a slurry between a polishing pad and the reverse film, and wherein a slurry selectivity ratio of the gate electrode layer to the reverse film is greater than 1, wherein after the step of applying the chemical mechanical polish process to the reverse film and the gate electrode layer, a top surface of the gate electrode layer over the second semiconductor fins is higher than and a top surface of the gate electrode layer over the first semiconductor fins.

16. The method of claim 15, wherein:
the first semiconductor fins are equally spaced apart from each other; and
the second semiconductor fins comprise a first group of fins and a second group of fins, and wherein a distance between the first group of fins and the second group of fins is greater than a distance between two adjacent fins in the first group of fins.

17. The method of claim 16, further comprising:
etching portions of the substrate to form a plurality of first isolation regions, a second isolation region, a plurality of third isolation regions and a fourth isolation region.

18. The method of claim 17, wherein:
two adjacent first semiconductor fins are separated by a first isolation region;
the first semiconductor fins and the second semiconductor fins are separated by the second isolation region;
two adjacent second semiconductor fins are separated by a third isolation region; and
the first group of fins and the second group of fins are separated by the fourth isolation region.

19. The method of claim 17, wherein:
a width of the fourth isolation region is at least five times greater than a width of the third isolation region.

20. The method of claim 15, wherein:
a height difference between the top surface of the gate electrode layer over the second semiconductor fins and the top surface of the gate electrode layer over the first semiconductor fins is proportional to a thickness of the reverse film.

* * * * *